US006239536B1

(12) United States Patent
Lakin

(10) Patent No.: US 6,239,536 B1
(45) Date of Patent: May 29, 2001

(54) ENCAPSULATED THIN-FILM RESONATOR AND FABRICATION METHOD

(75) Inventor: Kenneth Meade Lakin, Redmond, OR (US)

(73) Assignee: TFR Technologies, Inc., Bend, OR (US)

(*) Notice: Subject to any disclaimer, the term of this patent is extended or adjusted under 35 U.S.C. 154(b) by 0 days.

(21) Appl. No.: 09/149,319

(22) Filed: Sep. 8, 1998

(51) Int. Cl.[7] .................................................. H01L 41/04
(52) U.S. Cl. ............................................................ 310/364
(58) Field of Search ..................................... 310/363, 364

(56) References Cited

U.S. PATENT DOCUMENTS

| 4,511,816 | * | 4/1985 | Mikoshiba et al. ................... 310/313 |
| 5,571,603 | * | 11/1996 | Utumi et al. .......................... 428/212 |
| 5,760,663 | * | 6/1998 | Pradal ................................... 333/187 |

OTHER PUBLICATIONS

Lakin et al, "High Q Microwave Acoustic Resonators and Filters," IEEE MTT–S Digest. Jan. 1993, pp. 1517–1520.*
Physics of Semiconductor Devices, 2nd Ed., S.M. SZE Pub. by John Wiley & Sons p. 852.
Ceramic Industry, Jan. 1997, vol. 147 No. 1 pub. by Business News Publishing Co., p. 151.
CRC Handbook of Chemistry and Physics, College Edition 50th Edition, p. B–153.

* cited by examiner

Primary Examiner—Nestor Ramirez
Assistant Examiner—Peter Medley
(74) Attorney, Agent, or Firm—G. Joseph Buck

(57) ABSTRACT

A thin-film piezoelectric resonator and method of fabrication that includes a barrier layer of material between the underlying electrode and a layer of piezoelectric material. For example, in a resonator that uses zinc oxide for the layer of piezoelectric material, a barrier layer of aluminum nitride is deposited upon an underlying aluminum electrode to protect the aluminum electrode from oxidation or structural deformation during the subsequent deposition of the piezoelectric layer of zinc oxide. The barrier layer of aluminum nitride is deposited in a manner so as to provide a substrate having a substantial degree of uniformity of crystal orientation upon which the layer of piezoelectric material may then be deposited in a manner such that the piezoelectric layer will, itself, also have a substantial degree of uniformity in the orientations of its crystals. The resonator includes a second electrode deposited upon the upper surface of the piezoelectric material or upon the upper surface of a second barrier layer of aluminum nitride that is deposited upon the upper surface of the piezoelectric layer.

18 Claims, 3 Drawing Sheets

ENCAPSULATED THIN-FILM RESONATOR AND FABRICATION METHOD

The invention described herein was made under or in the course of a contract with the U.S. Government.

1. BACKGROUND OF THE INVENTION a. Field of the Invention

This invention pertains to piezoelectric resonators and methods for the fabrication of piezoelectric resonators. More particularly, this invention pertains to thin film piezoelectric resonators and methods for fabricating thin film resonators.

b. Description of the Prior Art

Piezoelectric resonators typically are used for the control of the frequency of oscillation of oscillators or as filters or components of filters that are used to select those frequency components of an electrical signal that lie within a desired band of frequencies while eliminating or attenuating those frequency components that lie outside the desired band of frequencies or that lie within specific undesired bands of frequencies.

At ultra high (UHF) and microwave frequencies, piezoelectric resonators have been fabricated using thin-film techniques such as those described in "Development of Miniature Filters for Wireless Applications", Lakin, Kline, McCarron, IEEE Trans. Microwave Theory and Techniques, Vol. 43, No. 12, December 1995, pp. 2933–2929; "Thin Film Bulk Acoustic Wave Filters for GPS", K. M. Lakin, G. R. Kline, and K. T. McCarron, 1992, Ultrasonics Symposium Proc. pp. 471–476; High-Q Microwave Acoustic Resonators and Filters," by Lakin, Kline and McCarron, IEEE Trans. on Microwave Theory and Techniques, Vol. 41, No. 12, December 1993, p. 2139. One such method of fabricating piezoelectric resonators consists of first depositing a layer of conducting material upon the upper surface of a non-conducting substrate and then removing portions of the conductor by etching so as to leave a desired conducting pattern which forms a lower electrode. The upper surface of the conductor is then used as a substrate upon which is deposited a layer of piezoelectric material. The upper surface of the piezoelectric material is then used as a substrate upon which is deposited another layer of conducting material. Portions of the upper-most conducting material are then removed by etching so as to leave a second conducting pattern of conductor which forms an electrode on the upper surface of the piezoelectric material. Each portion of the layer of piezoelectric matter that is sandwiched between the two electrodes, together with these bounding conductors forms the piezoelectric resonator. In some prior art devices, these resonators are supported upon one or more layers of material that provide, in effect, either a fixed surface having a high mechanical impedance to vibration, or a "free" surface having a low mechanical impedance to vibration. See, e.g. U.S. Pat. Nos. 3,414,832 and 5,373,268. In some prior art devices, areas of the substrate located beneath the resonators are removed so as to leave the resonators as thin membranes. See e.g., U.S. Pat. No. 4,456,850, which patent also discloses the use of multiple layers of piezoelectric material having offsetting temperature coefficients, that are combined to provide a resonant frequency for the resonator that is relatively insensitive to temperature variations. FIG. 1 depicts such a resonator of the prior art that includes electrodes 11 and 13 located respectively below and above a layer of piezoelectric material 12. Electrodes 11 and 13 typically are made of gold or aluminum.

A major factor in determining the performance of such resonators is the magnitude of the electromechanical coupling coefficient, $K^2$ (i.e. "K" squared), which coupling coefficient relates the strength of the electric field that is generated within the piezoelectric material, when it is mechanically deformed, to the amount of mechanical deformation. A resonator that utilizes a piezoelectric material that has a higher value of $K^2$ can, other things being equal, exhibit lower loss and higher quality or "Q". Such higher Q resonators typically provide better frequency control than lower Q resonators. Such high Q resonators also can be used as part of filters that have wider bandwidths and lower losses than filters using resonators that have a lower value of Q. Resonator $K^2$ and Q are effective values derived from the electrical impedance of the resonator through measurement and modeling. See, e.g. "High-Q Microwave Acoustic Resonators and Filters", Lakin, Kline and McCarron, IEEE Transactions on Microwave Theory and Techniques, Vol. 41, No. 12, December 1993, p. 2139. Accordingly effective $K^2$ and Q are determined by the composite of materials that make up the resonator.

Of the materials that are used to fabricate thin-film resonators, the piezoelectric ceramics such as barium titanate, lead zirconate titanate, lithium niobate, zinc oxide, lithium tetra borate and aluminum nitride have relatively high values for the electromechanical coupling coefficient $K^2$. However, in order to take advantage of the high value of $K^2$, a substantial portion of the crystalline structure within the piezoelectric material must be oriented in one, desired direction so that the piezoelectric layer of crystals can, in bulk, also exhibit the same high value of $K^2$. In order to obtain a piezoelectric layer of zinc oxide or aluminum nitride that has a substantial degree of uniformity in the orientations of its crystals, the piezoelectric layer usually is deposited upon a layer of material, e.g. gold or aluminum, which, itself, also has a substantial degree of uniformity in the orientations of its crystalline structure.

A substantial degree of uniformity of crystal orientations within the gold or aluminum electrode 11 can be obtained by depositing the gold or aluminum layer upon a substrate in circumstances in which the gold or aluminum atoms have a high mobility during the deposition process. Such high mobility for the gold or aluminum atoms can be obtained if, during the deposition process, the substrate upon which the gold or aluminum is deposited is held at an elevated temperature that is less than the melting temperature for the gold or aluminum.

Gold typically has been used as the substrate for a zinc oxide piezoelectric layer and aluminum typically has been used as the substrate for an aluminum nitride piezoelectric layer. Because zinc oxide has a higher value of $K^2$ than aluminum nitride, a piezoelectric layer of zinc oxide, in which the orientations of the crystalline structure have a substantial degree of uniformity, should exhibit a higher value for $K^2$ and equivalent Q of a similar layer of aluminum nitride. However, in prior art devices, the gold, that was used as the electrodes and as the substrate for the zinc oxide, introduced excessive mechanical losses at UHF and microwave frequencies and which resulted in lower Q resonators and poorer overall performance as compared to devices that utilized a piezoelectric layer of aluminum nitride and aluminum electrodes.

Attempts to fabricate useful resonators by depositing a piezoelectric layer of zinc oxide upon an aluminum substrate were not successful because the process for depositing the zinc oxide utilized an oxygen rich environment, which oxydized the surface layer of the aluminum substrate during the initial film nucleation stage of the deposition process. Although the underlying layer of aluminum had a highly oriented crystalline structure, the oxydized surface layer of aluminum acted as a screen between the underlying layer of aluminum and the zinc oxide that was being deposited upon the oxydized surface layer of aluminum. In addition, zinc oxide was typically sputter deposited at substrate temperatures near 300 degrees C., in which circumstance the unprotected aluminum films undergo a structural change known as hillocking which roughens the surface and reduces the effectiveness of the aluminum as a nucleation layer. As a consequence the uniformity of the orientations of the crystals within the zinc oxide was relatively low and the quality of the resonators was poor.

Attempts to fabricate useful resonators using zinc oxide were further complicated by the fact that the chemicals, such as mild acids and bases, that are ordinarily used in the fabrication of integrated circuits, attack zinc oxide.

2. SUMMARY OF THE INVENTION

The present invention is a resonator and a method for fabricating the resonator that, in its preferred embodiment utilizes zinc oxide for the layer of piezoelectric material and that utilizes aluminum for the electrodes. A thin layer of aluminum nitride is deposited upon the aluminum electrode, which layer protects the surface of the aluminum electrode from oxydation and pins the surface of the aluminum electrode to prevent structural changes while, at the same time, providing a layer of material having a substantial degree of uniformity in the orientations of its crystals to serve as a substrate for the deposition of the zinc oxide. The piezoelectric layer of zinc oxide also exhibits a substantially higher degree of uniformity in the orientation of crystals within the zinc oxide than was previously obtained in resonators that utilized aluminum electrodes without an intervening layer of aluminum nitride. As a consequence, at UHF and microwave frequencies, the resonator exhibits a higher Q and better performance than was exhibited by the prior art devices.

3. BRIEF DESCRIPTION OF THE DRAWINGS

4. DETAILED DESCRIPTION

Figure 1:
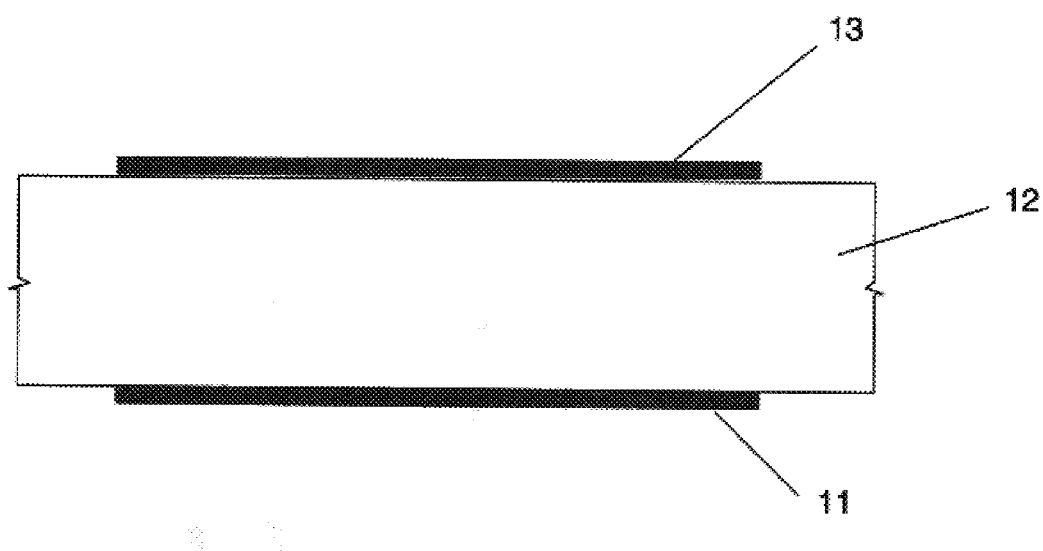
FIG. 1 depicts a thin-film resonator of the prior art.
Figure 2:
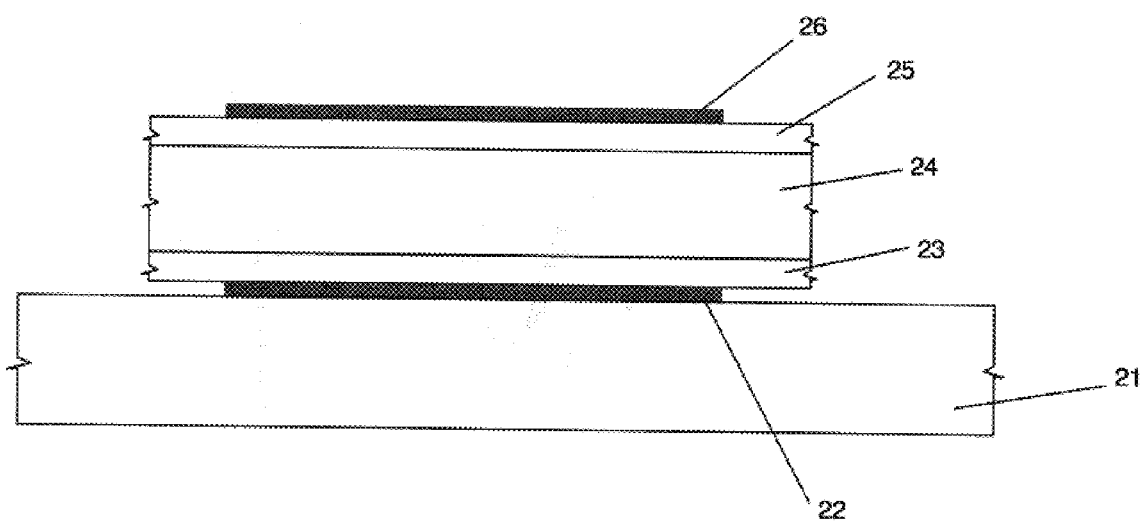
FIG. 2 depicts one embodiment of the present invention.

Referring to FIG. 2, a lower electrode 22 is fabricated by depositing aluminum or some other suitable conductor upon a substrate 21 by an evaporation or other deposition process that produces a layer of conducting material that has a substantial degree of uniformity in the orientations of the crystals within the conducting material. Portions of the layer of conducting material are then removed by etching or other means, so as to leave the desired pattern of conducting material as electrode 22. A barrier layer 23 of aluminum nitride or other suitable material is then deposited upon electrode 22 using an evaporation or other deposition process that produces a barrier layer 23 of material that also has a substantial degree of uniformity in the orientations of the crystals within the barrier layer. A piezoelectric layer 24 of zinc oxide or other suitable piezoelectric material is then deposited upon barrier layer 23.

Barrier layer 23 serves two important purposes. First, barrier layer 23 protects the upper surface of the aluminum or other material in electrode 22 from degradation caused by the environment that is used for the deposition of piezoelectric layer 24, e.g. from oxidation from the oxygen rich environment that typically is used in the deposition of zinc oxide or by the elevated substrate temperature causing structural changes on the electrode surface. Second, barrier layer 23, is deposited in a manner that retains a substantial degree of uniformity in the orientations of its crystals. Although, in some circumstances, it may be possible to deposit barrier layer 23 upon an amorphous substrate in a manner that produces a barrier layer having a substantial degree of uniformity in the orientations of its crystals, such substantial degree of uniformity usually can be obtained more easily by depositing the barrier layer upon a substrate that, itself, has a substantial degree of uniformity in the orientations of its cyrstals. The uniformity in the crystal orientations in barrier layer 23, in turn, facilitates the deposition upon it of piezoelectric layer 24 in a manner that produces a substantial degree of uniformity in the orientations of the crystals within the piezoelectric layer. A substantial degree of uniformity in the orientations of the crystals is intended to mean a high enough degree of uniformity so as to provide a resonator having usable and useful properties. For example, a piezoelectric layer of zinc oxide having a uniformity of crystal orientations such that an x-ray rocking curve examination exhibits a response curve having a full width, half-maximum of 2 degrees, is normally more than sufficient to provide a highly useful resonator.

In the embodiment depicted in FIG. 2, a second barrier layer 25 is then deposited upon piezoelectric layer 24. A layer of aluminum is then deposited upon barrier layer 25 and portions of the layer of aluminum are removed by etching or other suitable processes to leave a desired conducting pattern that forms electrode 26. Barrier layer 25 protects piezoelectric layer 24 from attack by the chemicals that typically are used to remove portions of the layer of aluminum in the fabrication of electrode 26. For example, if piezoelectric layer 24 were made of zinc oxide, then, in the absence of barrier layer 25, layer 24 would be attacked by the chemicals that typically are used in the etching process in the fabrication of electrode 26 resulting in the undercutting of the edges of electrode 26. The thicknesses of barrier layers 23 and 25 should be sufficient to avoid pin-hole effects. In these circumstances, a thickness of approximately 1000 Angstroms has been sufficient. As indicated above, in some circumstances, substrate 21 subsequently may be removed by etching or other suitable process to leave the resonator as a membrane.

Figure 3:
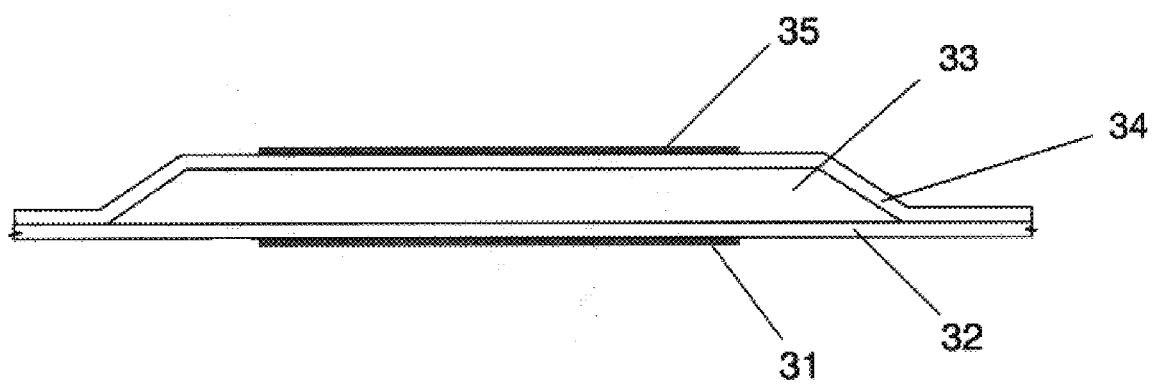
FIG. 3 depicts the preferred embodiment of the present invention.

Although the embodiment depicted in FIG. 2 protects the upper surface of piezoelectric layer 24 from attack by the chemicals that may be used for etching in the fabrication of electrode 26, the edges of piezoelectric layer 24 are still exposed to the environment at the boundaries of the die containing the resonator. For instance, at such boundaries each die may be exposed to water vapor, solder flux or other agents that may attack or degrade the piezoelectric material. FIG. 3 depicts the preferred embodiment of the invention, which embodiment encapsulates the piezoelectric layer within protective barrier layers. Referring now to FIG. 3, a barrier layer 32 of aluminum nitride or other suitable material is deposited upon lower electrode 31 in the same manner as described with respect to the embodiment depicted in FIG. 2. A piezoelectric layer of zinc oxide or other suitable piezoelectric material is then deposited upon barrier layer 32. Portions of the piezoelectric layer are then removed by etching or other suitable process so as to leave the bounded volume 33 of piezoelectric material that is depicted in FIG. 3. A barrier layer 34 of aluminum nitride or other suitable material is then deposited, which barrier layer 34, together with barrier layer 32 encapsulates bounded volume 33 of piezoelectric material and protects bounded volume 33 from attack by the chemicals that are used in the subsequent fabrication of upper electrode 35 on the upper surface of barrier layer 34 and also protects bounded volume 33 from attack by moisture or other agents that may be present at the edges of the die.

Referring now to FIG. 2, barrier layers 23 and 25 need not necessarily be piezoelectric. However, If barrier layer 23 and barrier layer 25 are made of a non-piezoelectric insulating material, then these layers, in effect, act as capacitances that are in series with the resonator that is formed by electrodes 22 and 26. These capacitances reduce the piezoelectric coupling coefficient of the resonator as compared to the coupling coefficient that otherwise would be achieved in the absence of these capacitances. However, if barrier layer 23 and barrier layer 25 consist of piezoelectric material that is deposited in a manner such that the orientations of the crystals within the layers have a substantial degree of uniformity in the desired direction, then the piezoelectric properties of these barrier layers contribute to the performance of the resonator and reduce any undesirable effects upon the performance. For example, if electrodes 22 and 26 are made of aluminum and piezoelectric layer 24 is made of zinc oxide, then aluminum nitride may be used to make barrier layers 23 and 25. If the aluminum nitride is deposited in a manner so as to obtain barrier layers in which the orientations of the crystals have a substantial degree of uniformity, then the layers will not only act as barriers, but the piezoelectric properties of aluminum nitride will contribute to the performance of the resonator. The alumininum nitride in barrier layer 23 normally would be of the piezoelectric form having a substantial degree of uniformity in the orientations of its crystals. The aluminum nitride in barrier layer 25, however, could, instead, be polycrystalline and non-piezoelectric. In the latter instance, layer 25 would still act as a barrier, but would not contribute to the piezoelectric effects within the device.

Referring again to FIG. 2, as indicated above, barrier layer 23 is a necessary part of this invention because it protects the conducting material in electrode 22 from attack during the deposition of piezoelectric layer 24 and because it provides a substrate having a substantial degree of uniformity in its crystal orientations, which, in turn, enables the deposition of piezoelectric layer 24 in a manner such that the piezoelectric layer also will have a substantial degree of uniformity in the orientation of its crystals. Barrier layer 23 also pins the surface of electrode 22 so as to prevent changes in the crystalline structure of electrode 22 that might otherwise occur during the deposition of piezoelectric layer 24. For example, aluminum nitride typically is deposited at a temperature of approximately 120 C., which temperature would not normally affect the surface structure of the aluminum electrode. Zinc oxide, however, typically is deposited at a temperature of approximately 300 C., at which temperature the surface structure of the aluminum electrode would likely be altered if the structure were not fixed in place or "pinned" in place by a barrier layer of aluminum nitride or other suitable material.

Although the embodiments described above utilize aluminum electrodes, aluminum nitride barrier layers and zinc oxide for the layer of piezoelectric material, other materials might instead be used so long as the materials were compatible and exhibited the properties necessary for the successful fabrication of the device.

It should be understood that the fabrication of piezoelectric layer 24 is completed prior to the addition of barrier layer 25. As a consequence, barrier layer 25 is not a necessary part of the invention. Electrode 26, instead, could be fabricated directly upon piezoelectric layer 24. The addition of barrier layer 25, however, does protect layer 24 from undercutting during the etching process used to form electrode 26. More importantly, the use of barrier layer 25 allows the conducting material used for electrode 26 to be selected independent of constraints that otherwise might be imposed by properties of layer 24. The addition of barrier layer 25 also makes the device more symmetrical, which symmetry may contribute to improved performance.

It also should be understood that neither barrier layer 23 nor barrier layer 25 need be made of a piezoelectric material. Furthermore, barrier layer 25 need not be fabricated so as to have a substantial degree of uniformity of crystal orientation unless barrier layer 25 is made of a piezoelectric material and one wishes to have this piezoelectric material also contribute to the electrical and mechanical interactions within the resonator.

I claim:

1. A method for fabricating thin film resonators comprising the steps of:

fabricating a lower electrode, fabricating a first barrier layer above the lower electrode made of a material that protects the lower electrode from degradation, fabricating a layer of piezoelectric material above the barrier layer, and fabricating an upper electrode above the layer of piezoelectric material, wherein the first barrier layer comprises a material having a substantial degree of uniformity in the orientations of its crystals and the layer of piezoelectric material has a substantial degree of uniformity in the orientations of its crystals.

2. The method of claim 1 wherein the first barrier layer protects the lower electrode from degradation during the fabricating of the layer of piezoelectric material.

3. The method of claim 2 in which the lower electrode is aluminum, the first barrier layer is aluminum nitride and the layer of piezoelectric material is zinc oxide.

4. The method of claim 1 and including the step of fabricating a second barrier layer between the layer of piezoelectric material and the upper electrode, said second barrier layer protecting the layer of piezoelectric material from degradation from the fabrication of the upper electrode.

5. The method of claim 4 in which the lower electrode is aluminum, the first barrier layer is aluminum nitride and the layer of piezoelectric material is zinc oxide.

6. The method of claim 1 in which the layer of piezoelectric material is fabricated so as to be bounded and the first barrier layer and the second barrier layer encapsulate the bounded layer of piezoelectric material and protect the bounded layer of piezoelectric material from degradation.

7. The method of claim 6 in which the lower electrode is aluminum, the first barrier layer is aluminum nitride and the layer of piezoelectric material is zinc oxide.

8. The method of claim 1 in which the lower electrode is aluminum, the first barrier layer is aluminum nitride and the layer of piezoelectric material is zinc oxide.

9. The method of claim 1 in which the lower electrode is aluminum, the first barrier layer is aluminum nitride and the layer of piezoelectric material is zinc oxide.

10. A thin film resonator comprising:

a lower electrode, a first barrier layer above the lower electrode made of a material that protects the lower electrode from degradation, a layer of piezoelectric material above the barrier layer; and an upper electrode above the layer of piezoelectric material, wherein the first barrier layer comprises a material having a substantial degree of uniformity in the orientations of its crystals and the layer of piezoelectric material has a substantial degree of uniformity in the orientations of its crystals.

11. The device of claim 10 and further including a second barrier layer located between the layer of piezoelectric material and the upper electrode.

12. The device of claim 11 in which the layer of piezoelectric material is bounded and the first barrier layer and the second barrier layer encapsulate the bounded layer of piezoelectric material and protect the bounded layer of piezoelectric material from degradation.

13. The device of claim 12 in which the lower electrode is aluminum, the first barrier layer is aluminum nitride and the layer of piezoelectric material is zinc oxide.

14. The device of claim 11 in which the lower electrode is aluminum, the first barrier layer is aluminum nitride and the layer of piezoelectric material is zinc oxide.

15. The device of claim 10 and further including a second barrier layer located between the layer of piezoelectric material and the upper electrode.

16. The device of claim 15 in which the lower electrode is aluminum, the first barrier layer is aluminum nitride and the layer of piezoelectric material is zinc oxide.

17. The device of claim 10 in which the lower electrode is aluminum, the first barrier layer is aluminum nitride and the layer of piezoelectric material is zinc oxide.

18. The device of claim 10 in which the lower electrode is aluminum, the first barrier layer is aluminum nitride and the layer of piezoelectric material is zinc oxide.

* * * * *